United States Patent [19]
Kawamoto et al.

[11] Patent Number: 4,924,186
[45] Date of Patent: May 8, 1990

[54] MAGNETIC RESONANCE IMAGING SYSTEM WITH AUXILIARY COMPENSATION COIL

[75] Inventors: Hiromi Kawamoto, Tochigi; Osamu Fujitsuka, Ootawara, both of Japan

[73] Assignee: Kabushiki Kaisha Toshiba, Kawasaki, Japan

[21] Appl. No.: 101,965

[22] Filed: Sep. 28, 1987

[30] Foreign Application Priority Data

Sep. 29, 1986 [JP] Japan .................................. 61-228232
Sep. 30, 1986 [JP] Japan .................................. 61-233466

[51] Int. Cl.⁵ ........................................... G01R 33/20
[52] U.S. Cl. .................................................... 324/320
[58] Field of Search ...................... 324/318, 319, 320; 335/299

[56] References Cited

U.S. PATENT DOCUMENTS 4,284,950  8/1981  Burl et al. ............................ 324/320
4,587,504  5/1986  Brown et al. ........................ 324/319
4,607,225  8/1986  Crooks ................................. 324/318
4,670,716  6/1987  Kunz ................................... 324/309
4,683,434  7/1987  Tschopp .............................. 324/320
4,700,136 10/1987  Yamaguchi et al. ................. 324/320
4,737,716  4/1988  Roemer et al. ...................... 324/319

Primary Examiner—Hezron E. Williams
Assistant Examiner—Kevin D. O'Shea
Attorney, Agent, or Firm—Foley & Lardner, Schwartz, Jeffery, Schwaab, Mack, Blumenthal & Evans

[57] ABSTRACT

A magnetic resonance imaging system comprises a static field generating section for generating a static field applied to an object, a gradient field application section for applying a gradient field in the form of a pulse to the object disposed in the static field, a high frequency wave transmitting/receiving section for applying an excitation pulse of a high frequency field to the object disposed in the static field and for detecting a magnetic resonance signal excited in the object, and a controlling/processing section for driving the gradient field application section and high frequency wave transmitting/receiving section at a predetermined timing and for processing the magnetic resonance signal to obtain magnetic resonance image data. The system further comprises at least one auxiliary coil, and a current supply section for supplying a current for compensating to the auxiliary coil.

8 Claims, 16 Drawing Sheets

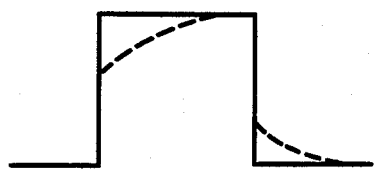
F I G. 1A
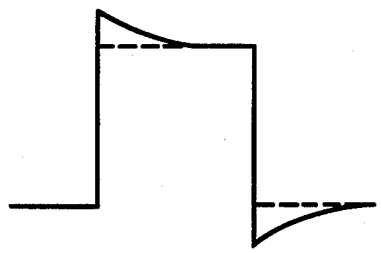
F I G. 1B
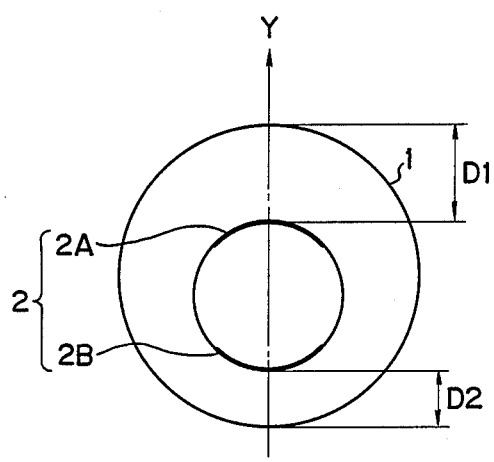
F I G. 2

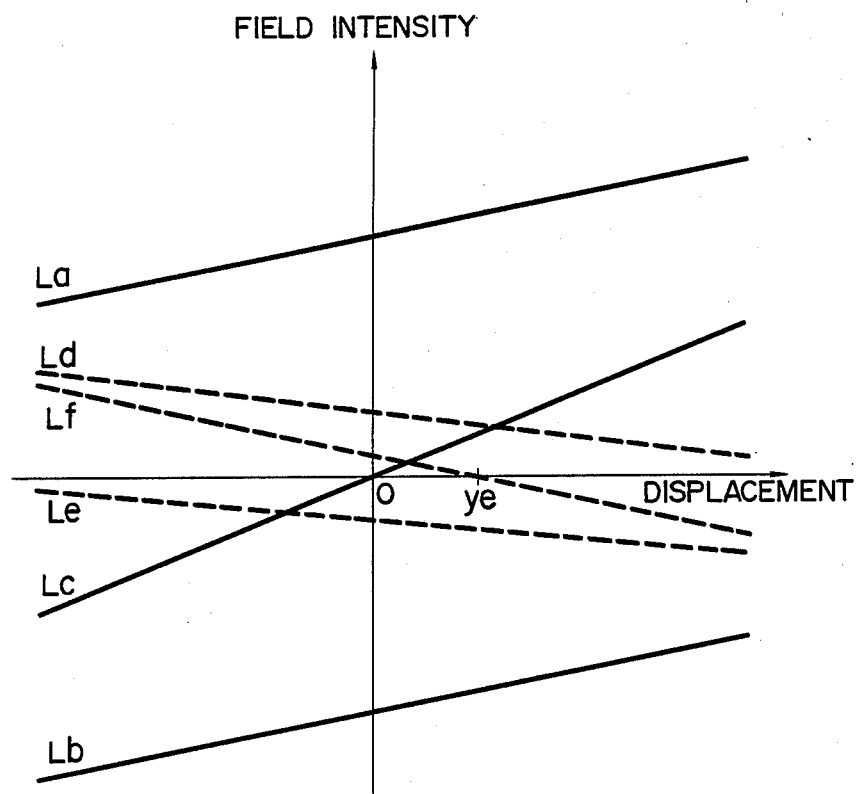
F I G. 3

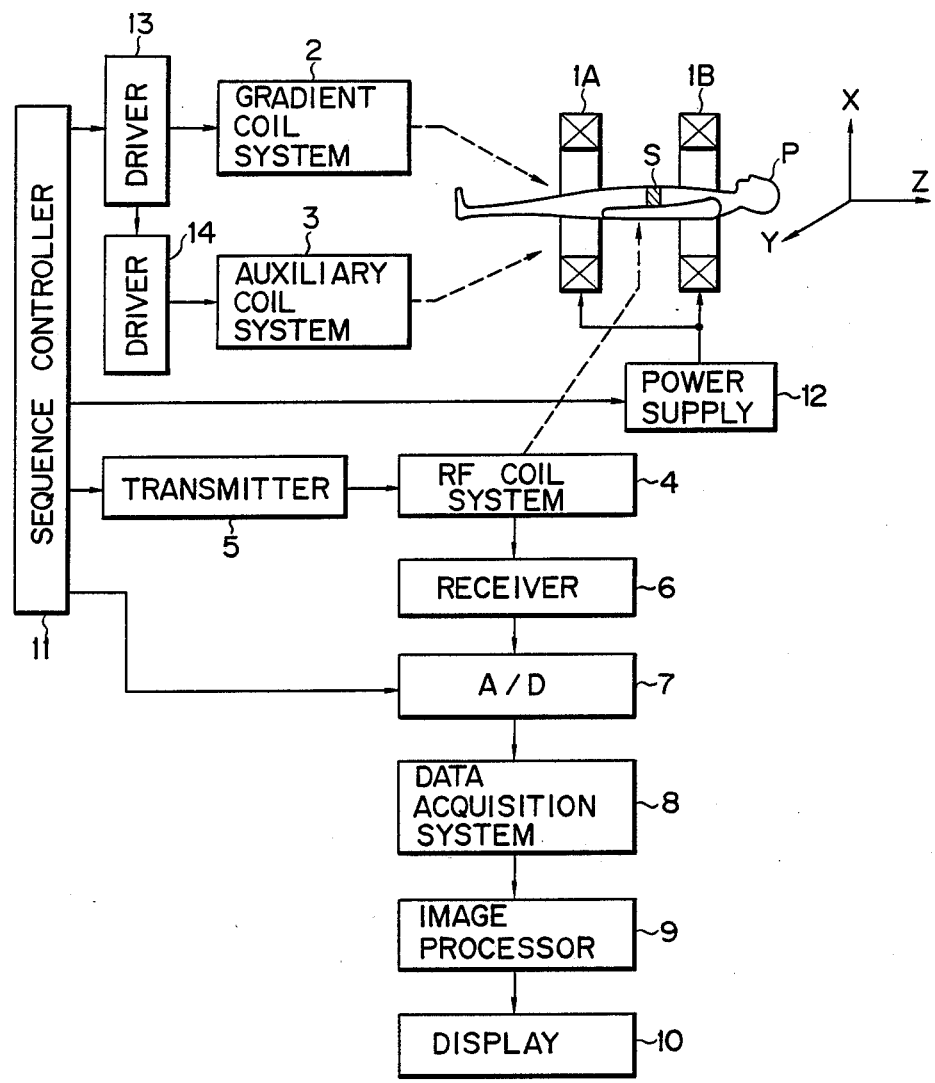
F I G. 6

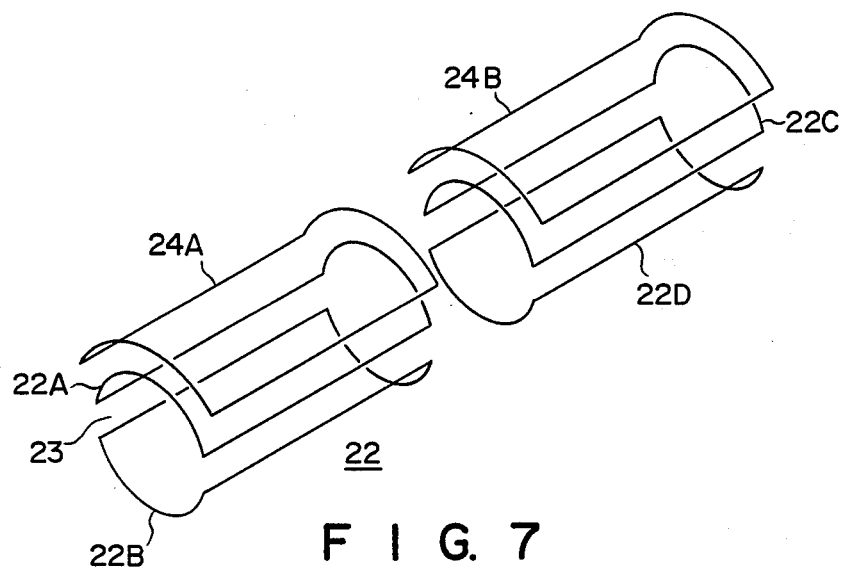
F I G. 7
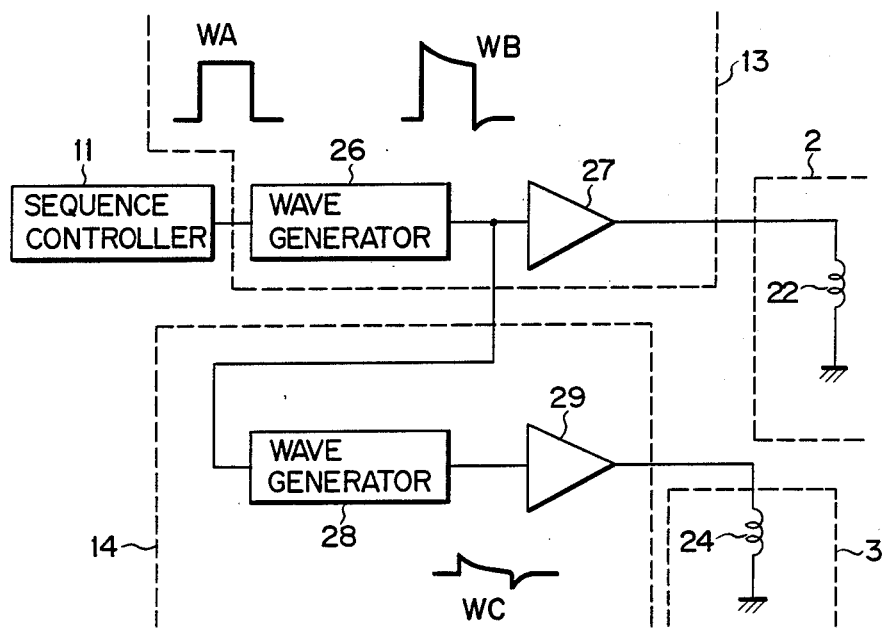
F I G. 8

FIG. 11A
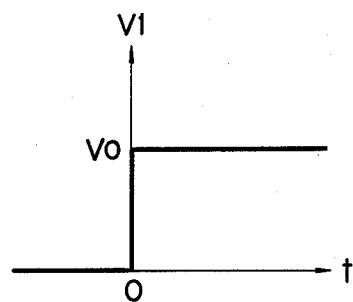
FIG. 11B  $\frac{R8}{R6} \cdot \frac{R2}{R1}$
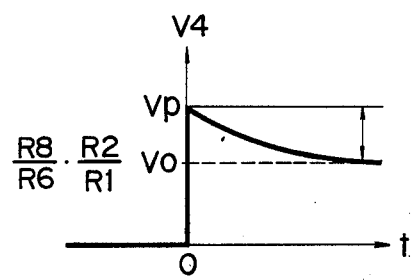

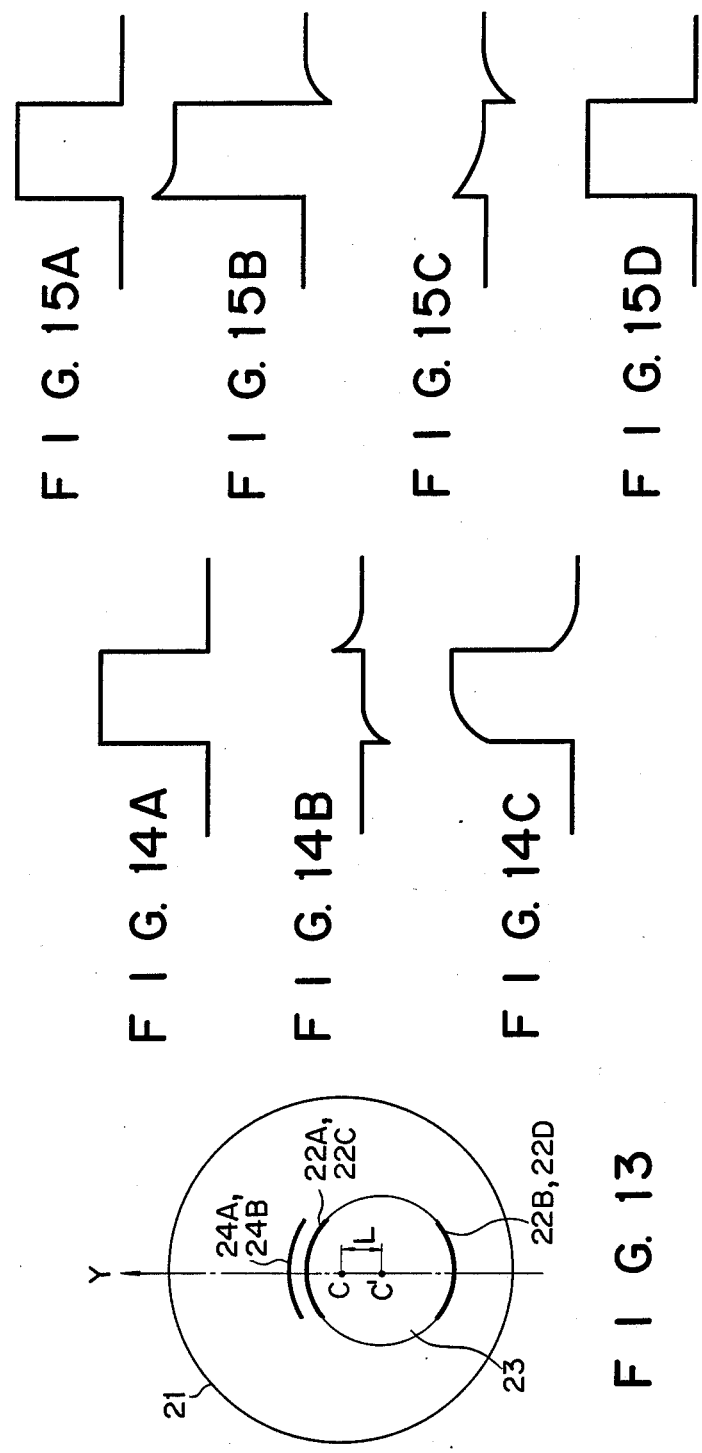

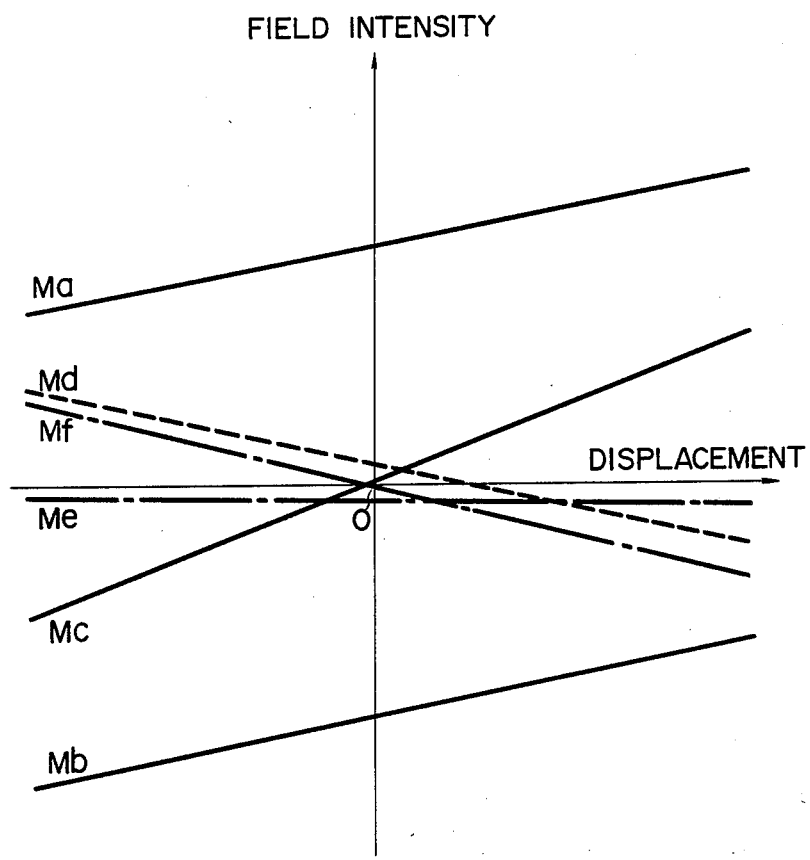
F I G. 16

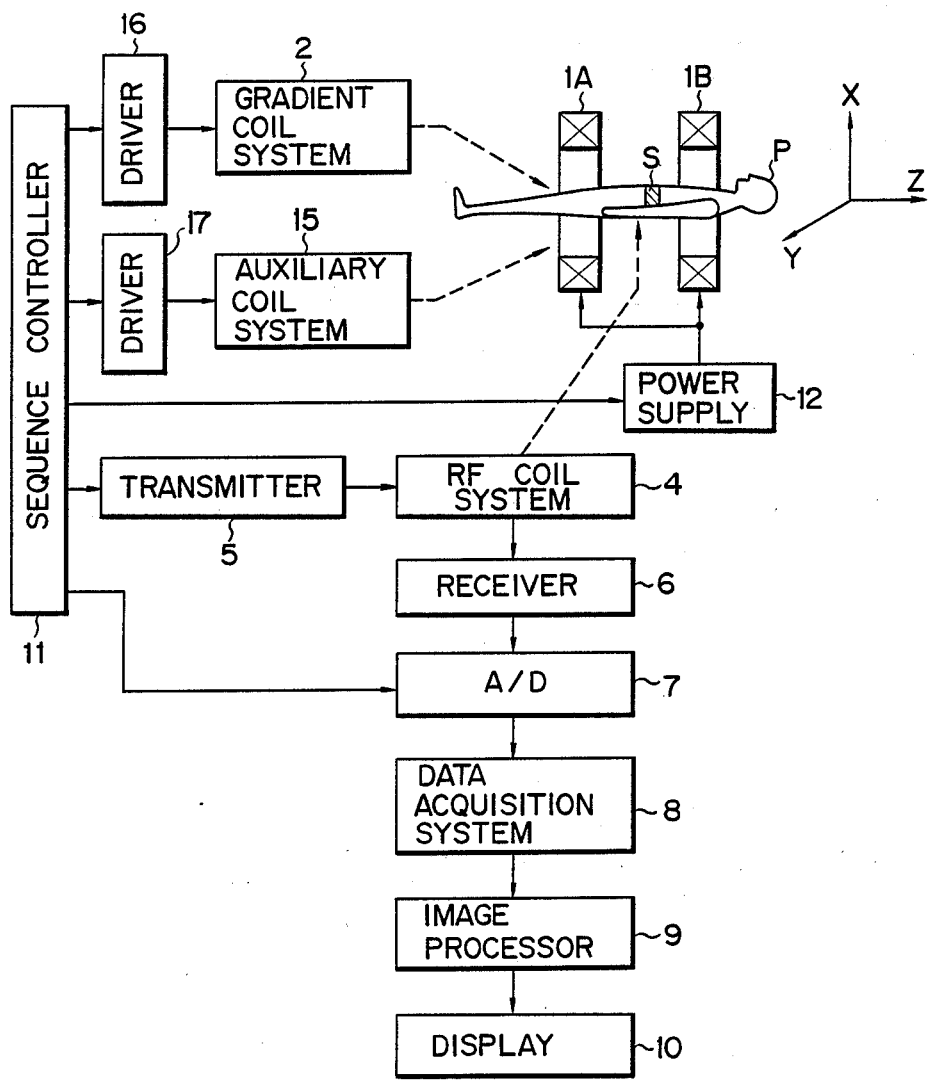
F I G. 19

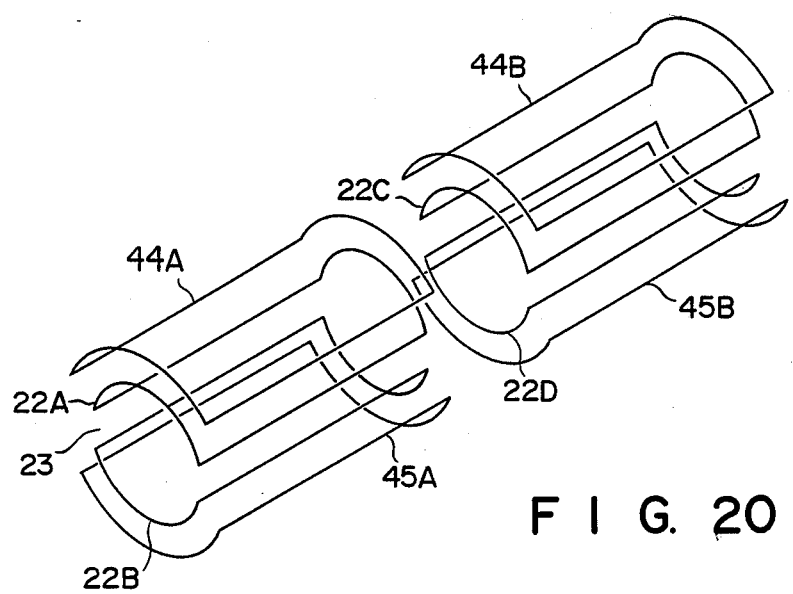
F I G. 20
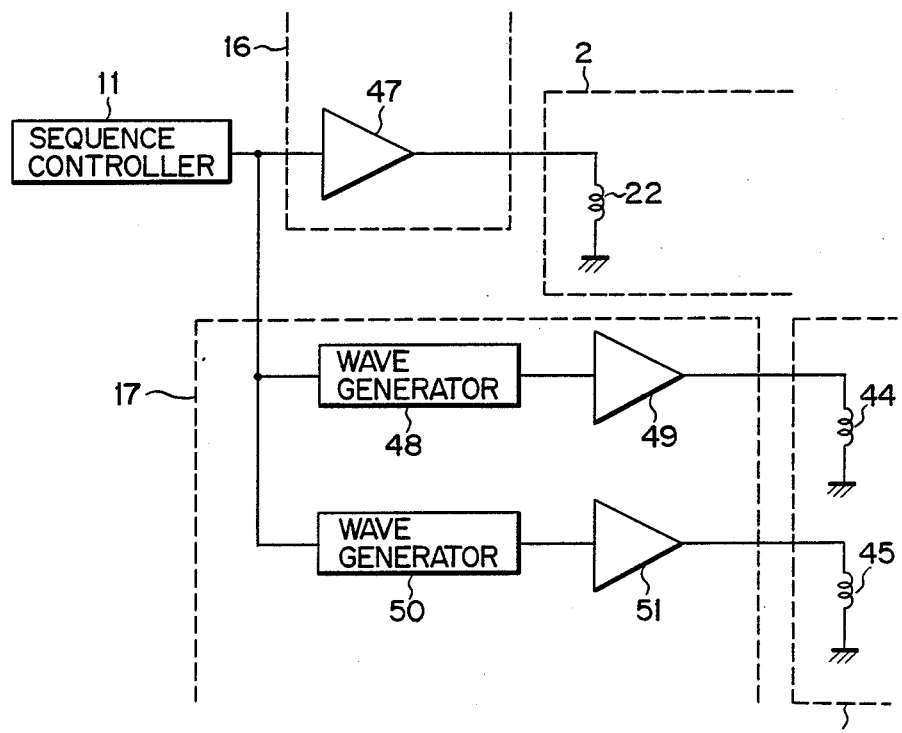
F I G. 21

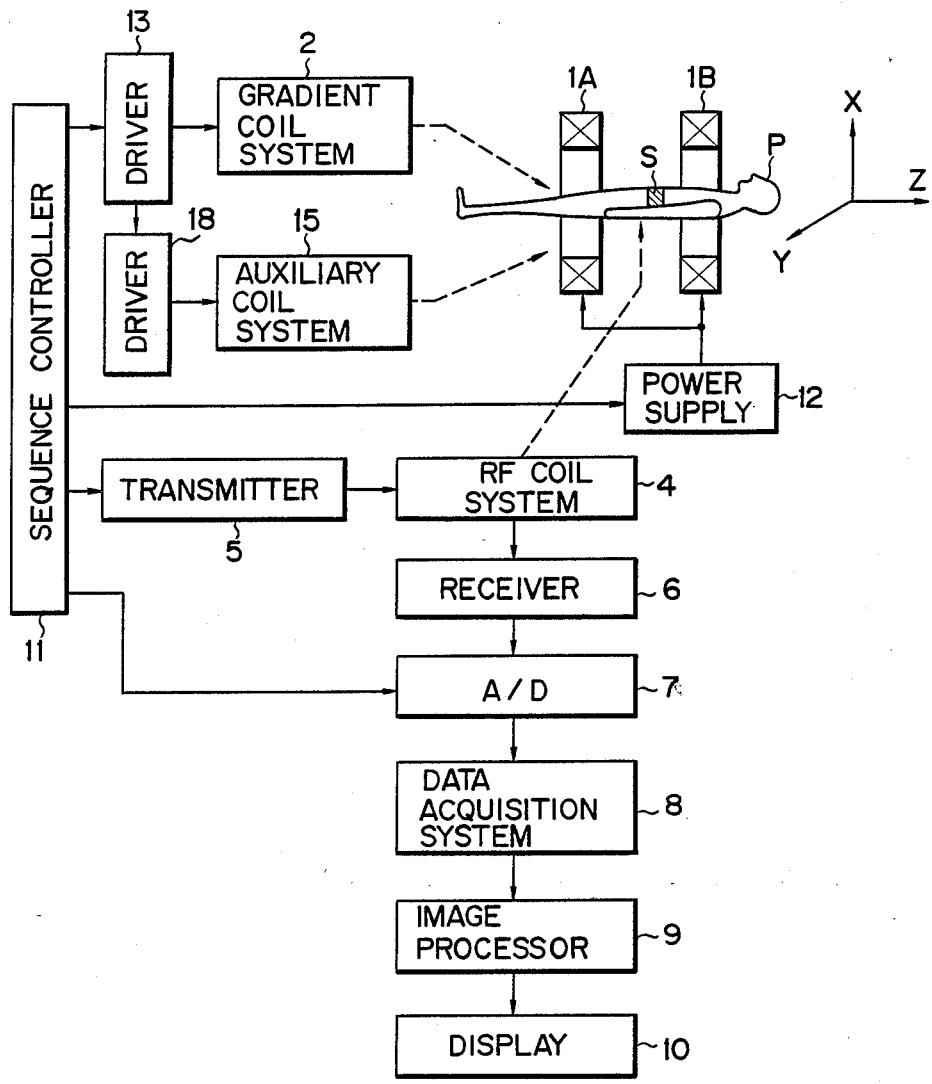
F I G. 22

MAGNETIC RESONANCE IMAGING SYSTEM WITH AUXILIARY COMPENSATION COIL

BACKGROUND OF THE INVENTION

This invention relates to a magnetic resonance imaging system (hereinafter referred to as an MRI system), in which a magnetic resonance (MR) phenomenon in a specific atomic nucleus is excited in an object to detect its MR data and to obtain an MR image with respect to a selected portion of the object and, more particularly, to an MRI system which makes it possible to obtain a suitable magnetic field.

In a well-known MRI system, an object is disposed in a static magnetic field, and a high frequency magnetic field orthogonal to the static magnetic field is applied to the object to produce a MR phenomenon while X-, Y- and Z-axis gradient fields are suitably superposed on the static magnetic field to detect a MR signal from the object so as to obtain an image based on the MR data.

In order to obtain a high quality image with this MRI system, it is desired that the X-, Y- and Z-gradient fields have a rectangular waveform as shown by the solid line in FIG. 1A. To obtain such a field waveform, pulse current is supplied to each gradient coil.

However, eddy current based on the gradient field is produced in conductive members adjacent to the gradient field coil, e.g., in frame, coils and shield member for the superconduction magnet. Due to the influence of the field that is produced by the eddy current, the waveform of the gradient field actually applied to the object is distorted as shown by the broken line in FIG. 1A. Therefore, the intensity of the applied gradient magnetic fields is not constant but varies with time. An image having satisfactory quality, therefore, can not be obtained by imaging using the gradient magnetic fields noted above. To compensate for the distortion of the waveform of the gradient magnetic field, a current, including an overshoot as shown by the solid line in FIG. 1B is supplied to generate the gradient magnetic field to make up for a change in current due to the waveform distortion problem. By so doing, the waveform can be corrected to a regular rectangular waveform as shown by the broken line in FIG. 1B.

However, another problem results when the conductive members and a gradient magnetic field coil, e.g., a Y-axis gradient magnetic field coil for generating a Y-axis gradient magnetic field (or an X-axis gradient magnetic field coil for generating an X-axis gradient magnetic field or a Z-axis gradient magnetic field coil for generating a Z-axis gradient magnetic field, although the Y-axis gradient magnetic field is considered for illustration in this example) is arranged asymmetrically with respect to the Y-axis direction, that is, when the distances D1 and D2 of upper and lower coils 2A and 2B of Y-axis gradient field coil 2 noted above, consisting of upper and lower coils 2A and 2B, from conductive member 1 are related as D1>D2.

The problem is that the center of the Y-axis gradient magnetic field and the center of a field that is produced by eddy current in the conductive member do not coincide but are rather deviate from each other.

Such positional deviation of the field centers will now be described specifically with reference to FIG. 3. In FIG. 3, the ordinate is the magnetic field intensity, and the abscissa is position (i.e., displacement) in the Y-axis direction. In the graph, line La represents a field set up by upper coil 2A, line Lb a field set up by lower coil 2B, line Lc a resultant field obtained from the fields of lines La and Lb, line Ld a field set up by eddy current due to the field of upper coil 2A, line Le a field set up by eddy current due to the field of lower coil 2B, and line Lf a resultant field obtained from the fields of lines Ld and Le. As is obvious from the graph, the center of the gradient magnetic field represented by line Lc, which is the resultant of the fields of lines La and Lb, passes through the origin O. The center of the eddy current field represented by line Lf, which is the resultant of the fields of lines Lc and Ld, does not pass through the origin O but, instead deviates by ye therefrom.

The center of the two magnetic fields do not coincide. The influence of the field to the eddy current varies with position. For this reason, a regular rectangular waveform as shown by the broken line in FIG. 1B can not be obtained even if a current including an overshoot is supplied as discussed above.

In an ordinary MRI system, the Y-axis gradient magnetic field equipment specifically has a structure as shown in FIG. 4, consisting of four saddle coil segments 2A to 2D, two of them disposed on each of the upper and lower sides of the space where the object is disposed, i.e., imaging area 3. A gradient magnetic field generation current supplied from a gradient magnetic field signal source 4 through amplifier 5 is supplied to the four coil segments 2A to 2D which are connected in series, as shown in FIG. 5.

As is shown, in the conventional MRI system, if the gradient magnetic field coil and a nearby conductive member are in an asymmetrical positional relation to each other, a gradient magnetic field having a desired rectangular waveform can not be obtained even by supplying a current including an overshoot to the gradient magnetic field.

Further, in a conventional MRI system the gradient magnetic field set up by a gradient magnetic field coil fails to have a desired rectangular waveform not only due to eddy current in a conductive member disposed in the neighborhood of the gradient magnetic field coil but also if there is a magnetic field source providing a magnetic field which is asymmetric with respect to the center of the coil.

SUMMARY OF THE INVENTION

An object of the invention is to provide an MRI system, which permits a desired magnetic field to be produced using a gradient magnetic field without being adversely affected by a field present in the neighborhood of the gradient magnetic field.

In the MRI system according to the invention, at least one auxiliary coil is provided on the outer side of a gradient coil, and a current supply section is provided to supply a compensation current for compensating for field to the auxiliary coil in synchronism to a gradient field generation current supplied to the gradient coil.

With the MRI system according to the invention, a gradient field generation current including a superposed compensation current for canceling an eddy current field deviation is supplied from the current supply section independently to the auxiliary coil and the gradient field coil, so that it is possible to make the center of the field due to eddy current and the center of the gradient field coincide.

Thus, a gradient field having a desired waveform, e.g., a pulse waveform, can be produced to obtain an MR image having superior quality.

Further, in another form of the MRI system according to the invention, at least one pair of auxiliary coils are provided in the neighborhood of the outer side of at least one pair of gradient field coils, and a compensation current for compensating is supplied from the current supply section to the auxiliary coils.

With the MRI system according to the present invention, a compensation current for compensating, e.g., a compensation current for canceling a deviation of a field due to eddy current produced in a conductive member disposed on the outer side of a gradient coil, is supplied from the current supply section to each auxiliary coil.

Thus, a gradient field having a desired waveform, e.g., a pulse waveform, can be produced to obtain an MR image having superior quality.

In still another form of the MRI system according to the present invention, at least one pair of auxiliary coils are provided on the outer side of a portion of the system for generating a field, and a compensation current for compensating is supplied from the current supply section to the auxiliary coils.

With the MR system according to the present invention, a compensation current for compensating is supplied from the current supply section to each auxiliary coil.

Thus, it is possible to prevent a field produced on the outer side of the auxiliary coils from adversely affecting a field applied to an imaging zone where the object is disposed, so that it is possible to obtain an MR image having superior quality. Also, by suitably controlling the compensation current supplied to the auxiliary coils it is possible to prevent the field produced for the MR imaging from leaking outside the MR equipment

BRIEF DESCRIPTION OF THE DRAWINGS

FIGS. 1A and 1B are waveform diagrams showing an ideal waveform of a gradient field applied to an object in a MRI system and a waveform of a field actually applied when a pulse wave is supplied to a gradient coil;

FIG. 2 is a schematic view showing a positional deviation between a gradient coil and a conductive member;

FIG. 3 is a graph for explaining the distribution of magnetic field intensity due to eddy current in gradient field coil and conductive member under the conditions shown in FIGS. 2A and 2B;

FIG. 6 is a block diagram showing a first embodiment of an MRI system according to the present invention;

FIG. 7 is a schematic view showing the shape and arrangement of part of a gradient coil system in the system shown in FIG. 6;

FIG. 8 is a schematic representation of a gradient coil system driver and a auxiliary coil system driver in the system shown in FIG. 6;

FIGS. 11A and 11B are waveform diagrams for explaining a compensation wave generator shown in FIG. 9;

FIG. 13 is a schematic view showing the positional relation of a conductive member, a gradient coil system and an auxiliary coil system in the system shown in FIG. 6;

FIGS. 14A to 14C and 15A to 15D are waveform diagrams for explaining the operation of the system shown in FIG. 6;

FIG. 16 is a graph for explaining the magnetic field intensity distribution due to eddy current produced in a gradient coil, an auxiliary coil and a conductive member in the system shown in FIG. 6;

FIG. 19 is a block diagram showing a second embodiment of an MRI system according to the present invention;

FIG. 20 is a schematic view showing the shape and arrangement of a gradient coil system and an auxiliary coil system in the system shown in FIG. 19;

FIG. 21 is a block diagram showing a gradient coil system driver and an auxiliary coil system driver in the system shown in FIG. 19;

FIG. 22 is a block diagram showing a third embodiment of an MRI system according to the present invention.

DETAILED DESCRIPTION OF THE PREFERRED EMBODIMENTS

Figure 4:
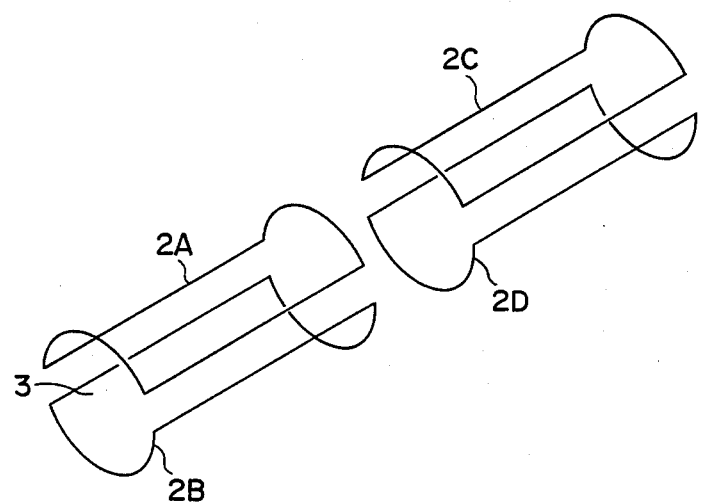
FIG. 4 is a schematic view showing the shape and arrangement of part of a gradient coil system in a prior art MRI system.
Figure 5:
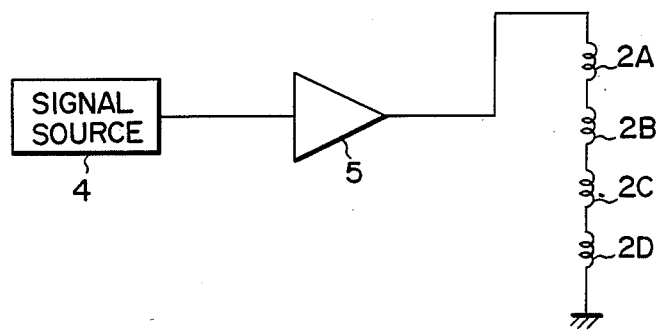
FIG. 5 is a schematic representation of the prior art gradient coil system driver shown in FIG. 4.

A first embodiment of an MRI system according to the present invention will be described with reference to FIG. 6.

The illustrated system comprises static field coils 1A and 1B, gradient coil system 2, auxiliary coil system 3, RF (radio frequency) coil system 4, transmitter 5, receiver 6, A/D (analog-to-digital) converter 7, data acquisition system 8, image processor 9, display 10, sequence controller 11, power supply 12, gradient coil driver 13 and auxiliary coil driver 14.

Paired static field coils 1A and 1B are driven by power supply 12 to generate uniform static magnetic fields applied to object P. Gradient coil system 2 is driven by gradient coil driver 13 to generate gradient fields. The gradient fields consist of a gradient field applied in the Z-axis direction to object P to determine the position of slice s of object P to be imaged and a gradient field extending in a predetermined direction in the X-Y plane applied to object P, i.e., gradient fields for reading and encoding. Although not obvious from FIG. 6, gradient coil system 2 usually includes X-, Y- and Z-axis gradient coils each consisting of at least one pair of coils. Auxiliary coil system 3 is driven by auxiliary coil driver 14 to generate a compensation field. The compensation for field is for compensating for the asymmetry of eddy current produced in a conductive member (not shown) that is found on the outer side of the X- and Y-axis gradient coils by the gradient field in the X-Y plane in a predetermined direction, the conductive member being assumed to be arranged asymmetrically in the direction of slope of the gradient field. Auxiliary coil system 3 consists of at least one coil which is disposed on the outer side of gradient coil system 2 and on the inner side of the conductive member. A location of auxiliary coil system 3 in illustrated in FIG. 7. RF coil 4 is driven by transmitter 5 to supply an excitation pulse to object P at a predetermined timing and also detects a MR signal produced in an object P and supplies it to receiver 6. In receiver 6, MR signal detected by RF coil 4 is detected by a phase-sensitive detector like a quadrature detector. A/D converter 7 converts MR data detected and extracted by receiver 6 into digital data to be supplied to data aquisition system 8. Data aquisition system 8 collects and stores MR data supplied through A/D converter 7. Image processor 9 processes MR data collected in data aquisition system 8 to produce MR image data. Display 10 displays an image corresponding to the MR image data generated in image processor 9. Sequence controller 11 controls the timing of operation of gradient coil driver 13, auxiliary coil driver 14, transmitter 5, A/D converter 7 and power supply 12 such that MR excitation and MR data collection are performed in a predetermined sequence. Auxiliary coil driver 14 is not directly controlled by sequence controller 11 but is operated in response to a signal from gradient coil driver 13.

Now, the operational principles and detailed construction of the MRI system shown in FIG. 6 will be described.

FIG. 7 is a perspective view showing part of gradient coil system used in the MRI system, e.g., the Y-axis gradient coil for generating the Y-axis gradient field and the related part of auxiliary coil system 3. More specifically, there is shown Y-axis gradient coil 22 consisting of four saddle coil segments 22A to 22D which are arranged as pairs on the upper and lower sides of imaging area 23, in which an object is disposed. Above coil segments 22A and 22C, above imaging area 23, is disposed Y-axis auxiliary coil 24 consisting of two saddle coil segments 24A and 24B in the proximity of and electrically insulated from respective coil segments 22A and 22C.

FIG. 8 shows in detail part of gradient coil driver 13 and auxiliary coil driver 14 for supplying driving current to Y-axis gradient coil 22 and Y-axis auxiliary coil 24, respectively.

In FIG. 8, a gradient field generation current signal generated from sequence controller 11 which serves as a signal source, is supplied to Y-axis gradient coil 22 through compensation wave generator 26 and driving amplifier 27 in gradient coil driver 13. Compensation wave generator 26 generates a drive signal having an overshoot waveform WB like the waveform of FIG. 1B in response to a current signal having a waveform WA like the waveform shown in FIG. 1A. A drive signal provided from compensation wave generator 26 is supplied to Y-axis auxiliary coil 24 through auxiliary coil drive wave generator 28 and drive amplifier 29 in auxiliary coil driver 14. Drive wave generator 28 generates an auxiliary coil drive signal having compensation waveform WC, in this response to the overshoot waveform WB from compensation wave generator 26.

Figure 9:
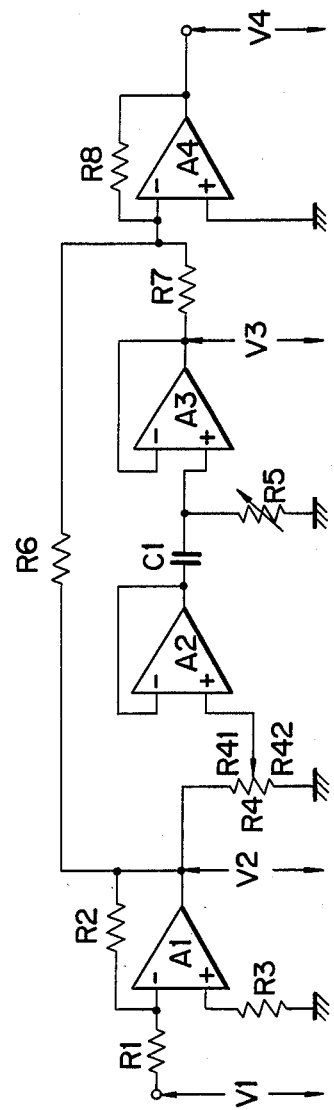
FIG. 9 is a circuit diagram showing a specific construction of a compensation wave generator shown in FIG. 8.
Figure 10:
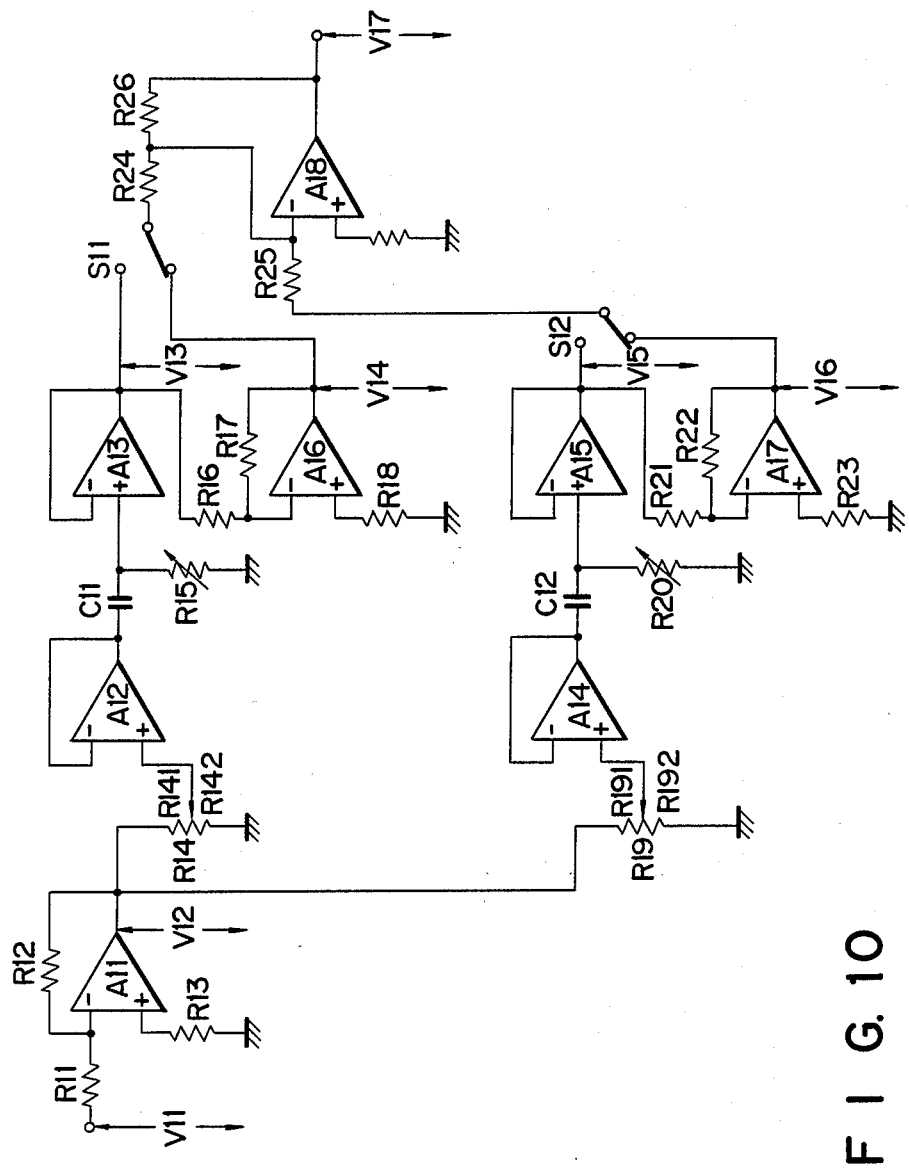
FIG. 10 is a circuit diagram showing a specific construction of a drive wave generator shown in FIG. 8.

FIGS. 9 and 10 are circuit diagrams showing specific circuit constructions of compensation wave generator 26 and drive wave generator 28.

Compensation wave generator 26 shown in FIG. 9 includes operational amplifiers A1 to A4, resistors R1 to R3 and R6 to R8, variable resistors R4 and R5 and capacitor C1.

Drive wave generator 28 shown in FIG. 10 consists of operational amplifiers A11 to A18, resistors R11 to R13, R16 to R18 and R21 to R26, variable resistors R14, R15, R19 and R20, capacitors C11 and C12 and switches S11 and S12.

The operation of circuit 26 as shown in FIG. 9 will now be described.

Denoting the level of the input signal to operational amplifier A1 by V1, the level of the output signal from operational amplifier A1 by V2, the level of the output signal from operational amplifier A3 by V3 and the level of the output signal of operational amplifier A4 by V4, output signal levels V2, V3 and V4 are given as $$V2 = -\frac{R2}{R1} V1$$

$$V3 = \frac{R42}{R4} \times V2 \times e^{-(t/C1\ R5)}$$

$$V4 = \left( \frac{U2}{R6} + \frac{U3}{R7} \right) R8$$

When signal level V1 has a step-like signal waveform as shown in FIG. 11A, output signal level V4 has a waveform as shown in FIG. 11B, and output signal level V4 constitutes a drive signal as the output of compensation wave generator 26.

Signal level Vp is given as $$Vp = \frac{R2}{R1} V1 \left( \frac{R8}{R6} + \frac{R8}{R7} \times \frac{R42}{R4} \right)$$

The operation of circuit 28 shown in FIG. 10 will now be described.

Denoting the level of the input signal to operational amplifier A11 by V11, the level of the output signal of operational amplifier A11 by V12, the level of the output signal of operational amplifier A13 by V13, the level of the output signal of operational amplifier A16 by V14, the level of the output signal of operational amplifier A15 by V15, the level of the output signal of operational amplifier A17 by V16 and the level of output signal of operational amplifier A18 by V17, when switches S11 and S12 are as shown in FIG. 10 (switched to the lower side in this case), output signal levels V12 to V17 are given as $$V12 = -\frac{R12}{R11} V11$$

$$V13 = \frac{R142}{R14} \times V12 \times e^{-(t/C11\ R15)}$$

$$V14 = -V13 = -\frac{R142}{R14} \times V12 \times e^{-(t/C11\ R15)}$$

$$V15 = \frac{R192}{R19} \times V12 \times e^{-(t/C12\ R20)}$$

$$V16 = -V15 = -\frac{R192}{R19} \times V12 \times e^{-(t/C12\ R20)}$$

-continued $$V17 = -\left(\frac{V14}{R24} + \frac{V16}{R25}\right)R26$$

Figure 12A:
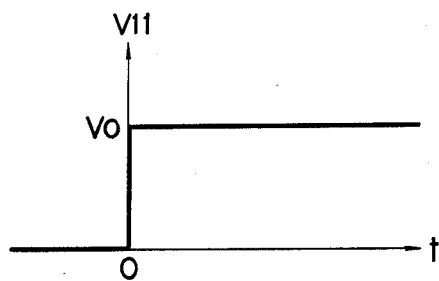
FIGS. 12A to 12E are waveform diagrams for explaining a drive wave generator shown in FIG. 10.
Figure 12B:
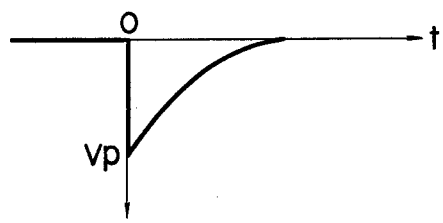

When signal level V11 has a step-like waveform as shown in FIG. 12A, output signal level V17 has a waveform as shown in FIG. 12B. Signal level VP is given as $$Vp = -\left(\frac{R142}{R24R14} + \frac{R192}{R26R19}\right)\frac{R12}{R11} V_o$$

Figure 12C:
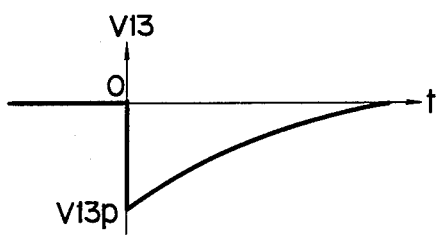
Figure 12D:
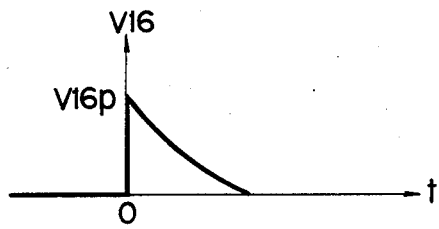
Figure 12E:
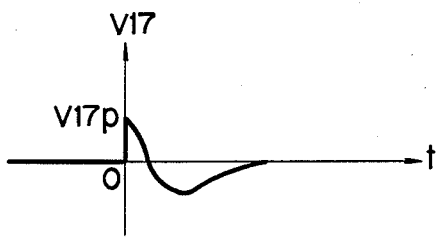

When switches S11 and S12 are on the opposite side to that shown in FIG. 10 (i.e., switched to the upper side), output signal levels V13, V16 and V17 have waveforms as shown in FIGS. 12C, 12D and 12E. Signal levels V13p and V16p are given as $$V13p = -\frac{R12R142}{R11R14} V11$$

$$V16p = \frac{R12R192}{R11R19} V11$$

Thus, by combining variable resistors R14, R15, R19 and R20 and switches S11 and S12, it is possible to obtain a drive signal for Y-axis auxiliary coil 24 for cancelling the deviation of the eddy current field when the Y-axis gradient coil and a conductive member in the neighborhood thereof are in an asymmetrical positional relation to each other.

Now, some benefits of the present MRI system will be explained.

As shown in FIG. 13, it is assumed that center C' of Y-axis gradient coil 22 is spaced apart and below center C of conductive member 21 by distance L in the Y-axis direction. That is, it is assumed that upper coil segments 22A and 22C and lower coil segments 22B and 22D of Y-axis gradient coil 22 are arranged asymmetrically in the Y-axis direction with respect to conductive member 21. In this case, upper coil segments 22A and 22C, more remote from conductive member 21, are less subject to the influence of the eddy current produced in conductive member 21, but lower coil segments 22B and 22D, closer to conductive member 21, is greatly influenced by eddy current. As a result, the influence of eddy current that is observed at center C' of Y-axis gradient coil 22 gets out of balance, so that there remains a signal waveform by lower coils 22B and 22D, as shown in FIG. 14B. Therefore, portions corresponding to the waveform shown in FIG. 14B are subtracted from the waveform of the pulse signal, as shown in FIG. 14A, supplied to Y-axis gradient coil 22, thus resulting in a distorted waveform as shown in FIG. 14C.

If Y-axis gradient coils 24A and 24B are arranged in the proximity of upper coil segments 22A and 22C, corresponding to lower coil segments 22B and 22D, having constituted a caused out-of-balance eddy current, and a compensation current as shown in FIG. 15C having the opposite characteristic to that of FIG. 14B is superposed on the waveform of FIG. 15A by compensation wave generator 26 as shown in FIG. 9, a resultant current having the waveform as shown in FIG. 15B is amplified by amplifier 27 and then supplied to Y-axis gradient coil 22. The current having the waveform as shown in FIG. 15B, provided from compensation wave generator 26, is converted by drive wave generator 28 shown in FIG. 10 into a waveform as shown in FIG. 15C and is supplied through amplifier 29 to Y-axis auxiliary coil 24. As a result, a gradient field pulse wave as shown in FIG. 15D, which is the resultant of (i.e., difference between) the waveform of FIG. 15B applied to Y-axis gradient coil 22 and the waveform of FIG. 15C applied to Y-axis auxiliary coil 24, is obtained at center C' of Y-axis gradient coil 22 of FIG. 13, at which the center of the object is located. In other words, by disposing Y-axis auxiliary coils 24A and 24B in the proximity of upper coils 22A and 22C and supplying to these coils a current having a waveform which can cancel the eddy current produced in conductive member 21, it is possible to obtain balanced and effective cancellation of the eddy current that is observed at center C'.

FIG. shows the characteristics of the gradient field obtained with the instant MRI system. It is possible to arrange the system such that the center of the eddy current field represented by line Mf, which is the resultant of line Me representing the eddy current field due to Y-axis auxiliary coil 24 and line Md representing the eddy current field due to Y-axis gradient coil 22, passes through origin O. Line Ma represents a field produced by upper coil segments 22A and 22C, line Mb a field produced by lower coil segments 22B and 22D, and line Mc a resultant field from the fields of lines Ma and Mb. It is thus possible to make the eddy current field center and gradient field center coincident and obtain an MR image having superior quality. Further, it is possible to reduce the inductance of coils 22 and 24 to permit reduction of the rise and fall times of the gradient field.

In the above description, only the Y-axis gradient coil has been described as the gradient field coil, but the same technique is applicable to the X-axis coil, and also the Z-axis coil.

Figure 17:
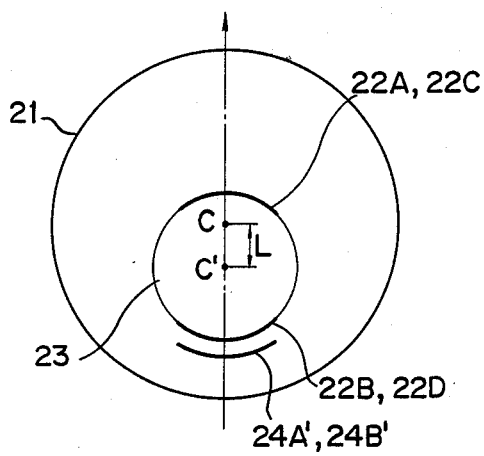
FIG. 17 is a schematic view showing a further positional relation of a conductive member, a gradient coil system and an auxiliary coil system in the system of FIG. 6.
Figure 18:
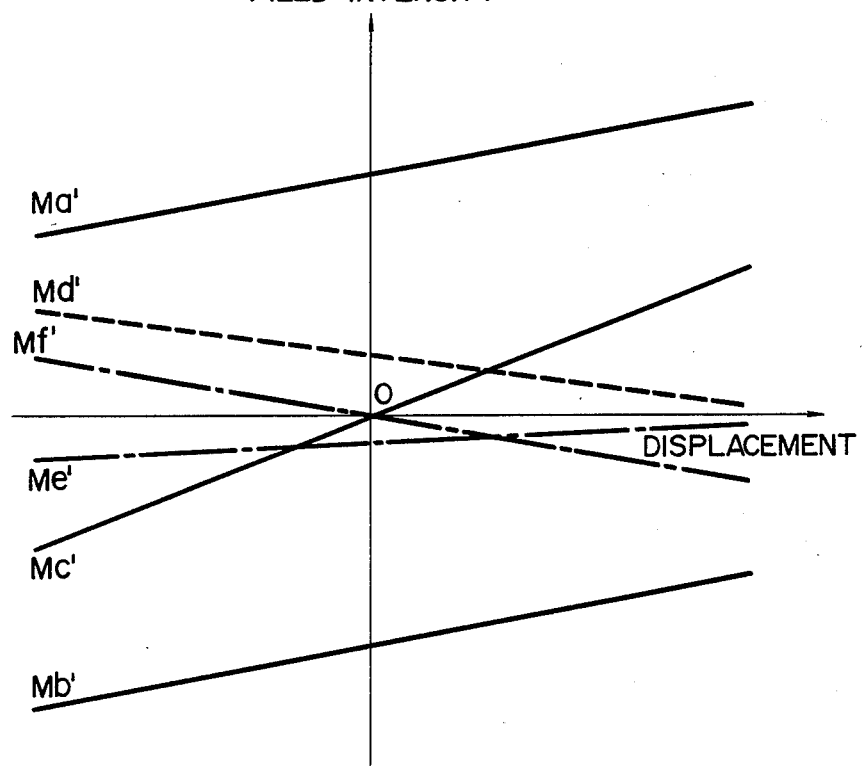
FIG. 18 is a graph for explaining the magnetic field intensity distribution due to eddy current produced in a gradient coil, an auxiliary coil and a conductive member when the arrangement of the coils shown in FIG. 17 is adopted in the system of FIG. 6.

Further, the above description has concerned a case where Y-axis auxiliary coil segments 24A and 24B are provided above upper coil segments 22A and 22C of Y-axis gradient coil 22. However, as shown in FIG. 17, coil segments 24A' and 24B' may be provided below lower coil segments 22B and 22D of Y-axis gradient coil 22. FIG. 18 shows the characteristics of the gradient field in this case. In FIG. 18, line Ma' represents a field produced by upper coil segments 22A and 22C, line Mb' a field produced by lower coil segments 22B and 22D, Mc' a resultant field from the fields of lines Ma' and Mb', line Md an eddy current field due to Y-axis gradient coil 22, line Me' an eddy current field due to Y-axis auxiliary coil 24', and line Mf' a resultant field from the fields of lines Md' and Me'. With this arrangement, the same effects as described before in connection with the previous example can be obtained. In addition, as is obvious from FIG. 18, the slope of line Mf' can be made particularly gentle, so that it is possible to reduce the current to be supplied to Y-axis auxiliary coil 24'.

A second embodiment of an MRI system according to the present invention will now be described with reference to FIG. 19.

The system shown in FIG. 19 is the same in structure as the system shown in FIG. 6 except for auxiliary coil system 15, gradient coil driver 16 and auxiliary coil driver 17. Auxiliary coil system 15 in the system shown in FIG. 19 includes one or more pairs of coils corresponding to gradient coil system 2. Further, auxiliary coil driver 17 for driving auxiliary coil system 15 is not controlled by gradient coil driver 16 but is directly controlled by sequence controller 11.

Now, the operational principles and detailed construction of the MRI system shown in FIG. 19 will be described.

FIG. 20 is a perspective view showing part of the gradient field coil system used in the MRI system, e.g., a Y-axis gradient coil for producing a Y-axis gradient field and related part of auxiliary coil system 15. More specifically, Y-axis gradient coil 22 including four saddle coil segments 22A to 22D, two of which are provided on each of the upper and lower sides of imaging area 23, in which an object is disposed. First Y-axis auxiliary coil 44 including two saddle coil segments 44A and 44B are disposed above coil segments 22A and 22C which are disposed above imaging area 23 in the vicinity of and electrically insulated from coil segments 22A and 22C of Y-axis gradient coil 22. Second auxiliary coil 45 consisting of two saddle coil segments 45A and 45B are disposed below coil segments 22B and 22D which are disposed below imaging area 23 in the vicinity of and electrically insulated from coil segments 22B and 22D of Y-axis gradient coil 22.

FIG. 21 shows in detail part of gradient coil driver 16 and auxiliary coil driver 17 for supplying drive currents to Y-axis gradient field coil 22 and first and second auxiliary coils 44 and 45. In place of the circuit arrangement set out above, another circuit arrangement may be employed instead which can drive respective individual auxiliary coil segments 44A, 44B, 45A and 45B independently of each other so that a proper correction may be made even in a situation where a nonsymmetric array or a nonsymmetric electrical/magnetic characteristic is involved.

In FIG. 21, a gradient field generation current signal generated from sequence controller 11 as a signal source is supplied from Y-axis gradient field coil 22 through drive amplifier 47 in gradient field coil system driver 16. The current signal is supplied from sequence controller 11 to first Y-axis auxiliary coil 44 through first drive wave generator 48 and drive amplifier 49 in auxiliary coil driver 17. The current signal is further supplied to second Y-axis auxiliary coil 45 through second drive wave generator 50 and drive amplifier 51 in auxiliary coil system driver 17.

First and second drive wave generators 48 and 50 specifically have the same construction as drive wave generator 28 shown in FIG. 10.

Thus, it is possible to obtain drive currents of first and second Y-axis auxiliary coils 44 and 45 for cancelling an eddy current field deviation when the Y-axis gradient coil system and nearby conductive member are in an asymmetrical positional relation to each other.

Of course, it is possible to provide a system having a construction similar to that of the first embodiment described above. Such a system is shown as a third embodiment of the invention.

A construction of the third embodiment is shown in FIG. 22.

The system shown in FIG. 22 comprises gradient coil driver 13 like that shown in FIG. 6 and auxiliary coil driver 18 which is the same as auxiliary coil driver 17 shown in FIG. 19 except that it responds to a signal from gradient coil driver 13.

Now, the operational principles and detailed structure of the MRI system shown in FIG. 22 will be described.

Figure 23:
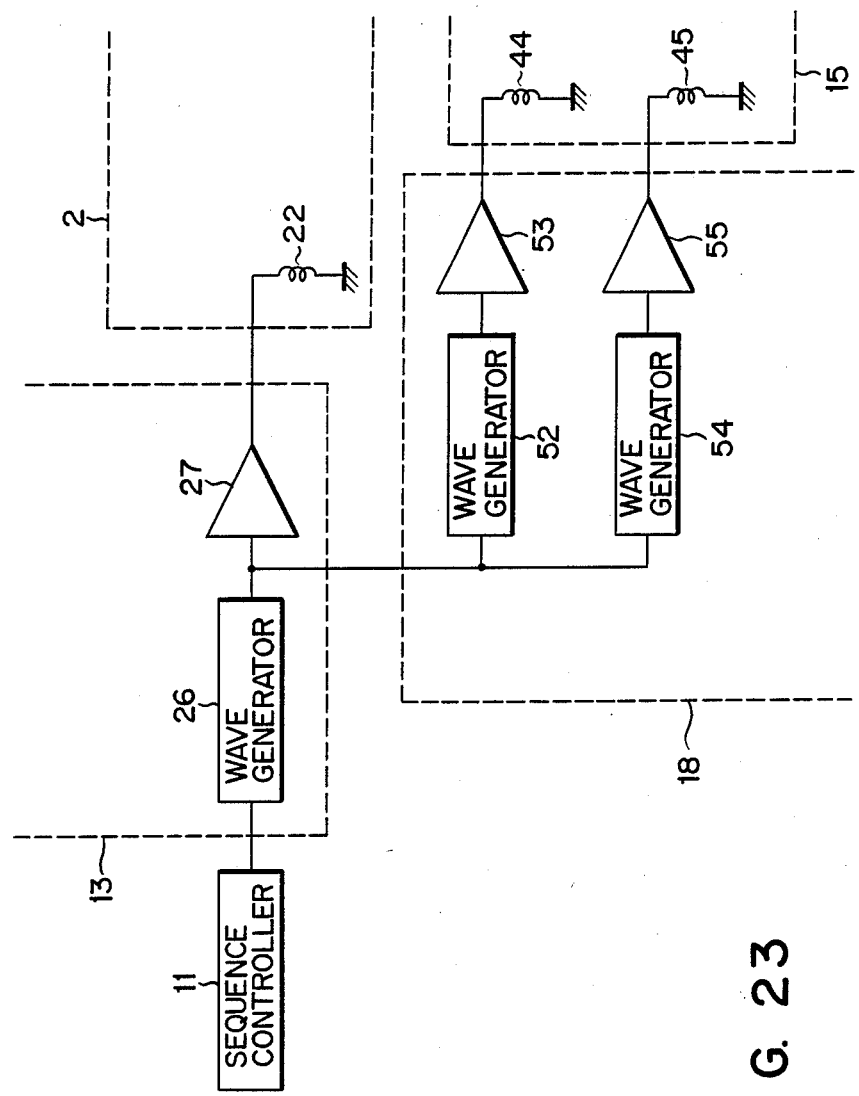
FIG. 23 is a schematic representation of a gradient coil system and an auxiliary coil system in the system shown in FIG. 22.

FIG. 23 shows in detail part of gradient coil driver 13 and auxiliary coil driver 18 for supplying drive currents to Y-axis gradient field coil 22 and first and second Y-axis auxiliary coils 44 and 45.

In FIG. 23, a gradient field generation current signal generated from the sequence controller as a signal source is supplied to Y-axis gradient field coil 22 through compensation wave generator 26 and drive amplifier 27 in gradient coil system driver 13. Gradient coil driver 13 is the same as that in the first embodiment shown in FIG. 8. A drive signal provided from compensation wave generator 26 is supplied to first Y-axis auxiliary coil 44 through first drive wave generator 52 and drive amplifier 53 in driver 18. The drive signal is also supplied from compensation wave generator 26 to second Y-axis auxiliary coil 45 through second drive wave generator 54 and drive amplifier 55 in auxiliary coil system driver 18. Auxiliary coil driver 18 is substantially the same as auxiliary coil driver 17 shown in FIG. 21 except that the input signal is supplied from compensation wave generator 26.

The structure shown in FIG. 23 is different from the structure shown in FIG. 21 in that in the structure of FIG. 21 no compensation wave circuit is provided in gradient coil driver 16 while drive wave generators 48 and 50 are operated by receiving the output of sequence controller 11, whereas in the structure of FIG. 23, compensation wave generator 26 is provided in gradient coil driver 13 and drive wave generators 52 and 54 are operated by receiving the output of compensation wave generator 26.

A specific example of compensation wave generator 26 is as described before with reference to FIG. 9, and first and second drive wave generators 52 and 54 are the same as wave generator 28 shown in FIG. 10.

With the second and third embodiments of the system, the undesired effect of a magnetic field from the outer side of auxiliary coil system 15 to the inner side thereof can be effectively canceled by auxiliary coil system 15, and a proper necessary field can be produced in the imaging area, where the object is arranged to obtain an image having superior quality.

With the second and third embodiments of the system, first and second Y-axis auxiliary coils 44 and 45 can be controlled independently, and the individual coil segments may be controlled independently. In this case, it is possible to arrange the system such that a plurality of auxiliary coils are driven by a common drive signal by independently adjusting their turns numbers.

Further, with the structure of the second and third embodiments it is not only possible to effectively reduce or remove the adverse effect of a field from the outside of coils provided in the MRI system to the imaging area therein, but also it is possible to prevent the effect of the field from leaking from the system itself to the neighborhood thereof through control of the auxiliary coil system. To prevent leakage of the effect of the field from the system itself to the neighborhood thereof, a field which can cancel the field leaking from the system itself to the outside may be produced by the auxiliary coil system.

What is claimed is:

1. A magnetic resonance imaging system, comprising: static field generation means for generating a static field applied to an object, gradient field application means including at least one pair of gradient field coils for applying a gradient field in the form of a pulse to the object disposed in said static field, high frequency wave transmitting/receiving means having high frequency coil means for applying a high frequency excitation pulse to the object in said static field and for detecting a magnetic resonance signal excited in said object, controlling/processing means for driving said gradient field application means and high frequency wave transmitting/receiving means at predetermined timing and for processing a magnetic resonance signal obtained by said high frequency wave transmitting/receiving means to obtain magnetic resonance image data, and a conductive member disposed in the vicinity of the gradient field, said magnetic resonance imaging system further comprising:

auxiliary coil means, disposed independently of said gradient field coils, for producing a compensation field so as to cancel an eddy current which the gradient field causes in said conductive member, said auxiliary coil means being operated such that the center of said gradient field coincides substantially with the center of a field produced by said eddy current; and current supply means for supplying a compensation current to said auxiliary coil means, in a manner to produce said compensation field.

2. A magnetic resonance imaging system according to claim 1, wherein said auxiliary coil means is arranged based on the distribution of an external field source disposed outside said static field generation means, high frequency coil means and gradient field coil means and wherein said auxiliary coil means is capable of producing a field in the neighborhood of the object, and wherein said current supply means supplies a current for compensating for the distribution of said external field source.

3. A magnetic resonance imaging system according to claim 1, wherein said auxiliary coil means includes at least a pair of coils, and wherein said current supply means supplies a current for generating a field for canceling a field generated in at least part of said static field generation means, high frequency coil means, and/or gradient field coil means.

4. A magnetic resonance imaging system as set forth in claim 1 above, wherein said auxiliary coil means is controlled in a manner to prevent the fields generated by the magnetic resonance imaging system from leaking into the spaces in the neighborhood of the magnetic resonance imaging system.

5. A magnetic resonance imaging system, comprising: static field generation means for generating a static field applied to an object, gradient field application means including at least one pair of gradient field coil means for applying a gradient field in the form of a pulse to the object disposed in said static field, high frequency wave transmitting/receiving means including a high frequency coil means for applying a high frequency excitation pulse to the object disposed in said static field and for detecting a magnetic resonance signal excited in said object, and controlling/processing means for driving said gradient field application means and said high frequency wave transmitting/receiving means at a predetermined timing and for processing a magnetic resonance signal obtained by said high frequency wave transmitting/receiving means to obtain magnetic resonance image data, said magnetic resonance imaging system further comprising:

at least one auxiliary coil means disposed on the outer periphery of said gradient field coil means; and current supply means for supplying a current, for compensating for the field generated by said gradient field coil means, to said auxiliary coil means;

wherein said auxiliary coil means includes a plurality of coils provided in correspondence to said gradient field coil means, and wherein said current supply means supplies compensation currents independently to said plurality of coils in synchronism to a signal for driving said gradient field coil means.

6. The magnetic resonance imaging system according to claim 5, wherein said plurality of coils are saddle coils.

7. A magnetic resonance imaging system, comprising: static field generation means for generating a static field applied to an object, gradient field application means including at least one pair of gradient field coil means for applying a gradient field in the form of a pulse to the object disposed in said static field, high frequency wave transmitting/receiving means including a high frequency coil means for applying a high frequency excitation pulse to the object disposed in said static field and for detecting a magnetic resonance signal excited in said object, and controlling/processing means for driving said gradient field application means and said high frequency wave transmitting/receiving means at a predetermined timing and for processing a magnetic resonance signal obtained by said high frequency wave transmitting/receiving means to obtain magnetic resonance image data, said magnetic resonance imaging system further comprising:

at least one auxiliary coil means disposed on the outer periphery of said gradient field coil means; and current supply means for supplying a current, for compensating for the field generated by said gradient field coil means, to said auxiliary coil means;

wherein said auxiliary coil means includes at least one coil provided in correspondence to part of said gradient field coil means, and wherein said current supply means responds to a signal for driving said gradient field coil means.

8. The magnetic resonance imaging system according to claim 7, wherein said at least one coil is a saddle coil.

* * * * *